(12) United States Patent
Osawa et al.

(10) Patent No.: US 9,627,586 B2
(45) Date of Patent: Apr. 18, 2017

(54) ELECTROLUMINESCENT ELEMENT AND LIGHTING APPARATUS COMPRISING THE SAME

(71) Applicant: Konica Minolta, Inc., Chiyoda-ku, Tokyo (JP)

(72) Inventors: Kou Osawa, Amagasaki (JP); Mitsuru Yokoyama, Takatsuki (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/407,608

(22) PCT Filed: Apr. 16, 2013

(86) PCT No.: PCT/JP2013/061239
§ 371 (c)(1),
(2) Date: Dec. 12, 2014

(87) PCT Pub. No.: WO2013/187118
PCT Pub. Date: Dec. 19, 2013

(65) Prior Publication Data
US 2015/0155443 A1 Jun. 4, 2015

(30) Foreign Application Priority Data
Jun. 14, 2012 (JP) .................................. 2012-134789

(51) Int. Cl.
*H01L 33/42* (2010.01)
*H01L 51/52* (2006.01)
(52) U.S. Cl.
CPC .......... *H01L 33/42* (2013.01); *H01L 51/5215* (2013.01); *H01L 51/5234* (2013.01); *H01L 51/5275* (2013.01); *H01L 2251/5323* (2013.01)
(58) Field of Classification Search
USPC ......................................................... 257/98
See application file for complete search history.

(56) References Cited

U.S. PATENT DOCUMENTS

| 4,670,690 A * | 6/1987 | Ketchpel ............... H05B 33/22 313/505 |
| 2004/0169624 A1 | 9/2004 | Yamazaki et al. |

(Continued)

FOREIGN PATENT DOCUMENTS

| JP | 10-294182 A | 11/1998 |
| JP | 2004-265691 A | 9/2004 |

(Continued)

OTHER PUBLICATIONS

NPL, EPO Search Report.*

(Continued)

*Primary Examiner* — Zandra Smith
*Assistant Examiner* — Lawrence Tynes, Jr.
(74) *Attorney, Agent, or Firm* — Cantor Colburn LLP

(57) ABSTRACT

An electroluminescent element includes a first transparent electrode, a second transparent electrode, a light emitting layer sandwiched between the first transparent electrode and the second transparent electrode, a first transparent member formed on a surface of the first transparent electrode opposite to the light emitting layer, and a second transparent member formed on a surface of the second transparent electrode opposite to the light emitting layer, wherein refractive indices of the first transparent electrode and the second transparent electrode are selected such that as seen from the light emitting layer, a reflectance of an interface between the light emitting layer and the first transparent electrode becomes higher than a reflectance of an interface between the light emitting layer and the second transparent electrode, and wherein a refractive index of the first transparent member is set to be higher than a refractive index of the second transparent member.

15 Claims, 11 Drawing Sheets

(56) References Cited

U.S. PATENT DOCUMENTS

| | | |
|---|---|---|
| 2005/0024339 A1 | 2/2005 | Yamazaki et al. |
| 2005/0088080 A1 | 4/2005 | Cheng et al. |
| 2006/0049419 A1 | 3/2006 | Tanaka |
| 2007/0085476 A1* | 4/2007 | Hirakata ............ H01L 51/5281 313/506 |
| 2008/0048561 A1 | 2/2008 | Cheng et al. |
| 2008/0129191 A1* | 6/2008 | Lee .................... H01L 51/5262 313/504 |
| 2008/0129193 A1 | 6/2008 | Asabe et al. |
| 2010/0109508 A1* | 5/2010 | Okuyama .......... C09K 11/0883 313/486 |
| 2011/0068681 A1* | 3/2011 | Naganawa ............ C09K 11/02 313/503 |
| 2012/0104423 A1* | 5/2012 | Kurata .................. H05B 33/28 257/88 |

FOREIGN PATENT DOCUMENTS

| | | |
|---|---|---|
| JP | 2005-129496 A | 5/2005 |
| JP | 2006-165034 A | 6/2006 |
| JP | 2006253044 A | 9/2006 |
| JP | 2008-130449 A | 6/2008 |
| JP | 2011-65781 A | 3/2011 |
| JP | 2012-15122 A | 1/2012 |
| WO | 2004/077386 A1 | 9/2004 |

OTHER PUBLICATIONS

International Search Report corresponding to Patent Application No. PCT/JP2013/061239; Date of Mailing: Jul. 23, 2013, with English translation.

Extended European Search Report corresponding to Application No. 13804542.2-1555/2863715 PCT/JP2013/061239; Date of mailing: Jan. 21, 2016.

* cited by examiner

FIG.7
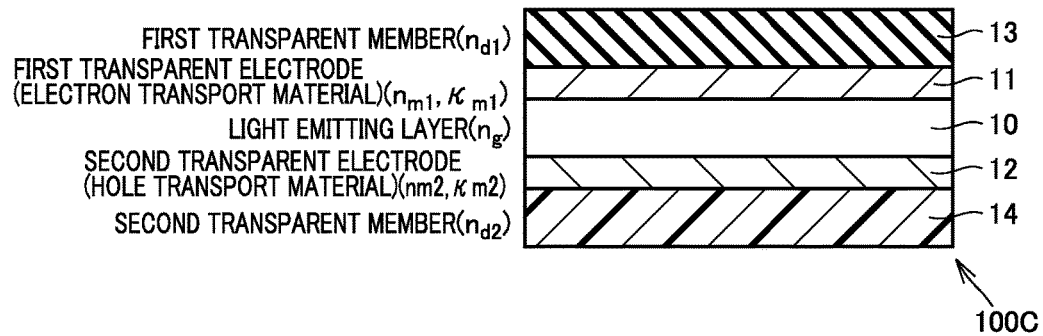
FIG.8
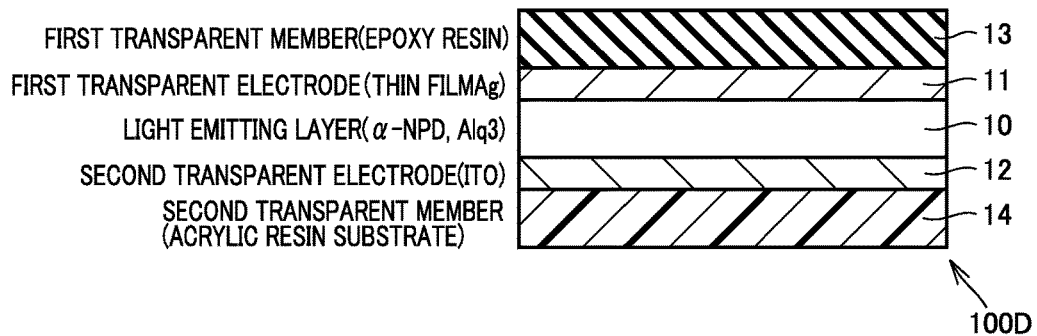
FIG.9
| MEMBER | MATERIAL | THICKNESS | REFRACTIVE INDEX n | EXTINCTION COEFFICIENT $\kappa$ |
|---|---|---|---|---|
| FIRST TRANSPARENT MEMBER | EPOXY RESIN | 100 MICROMETERS | 1.65 | 0 |
| FIRST TRANSPARENT ELECTRODE | THIN FILM Ag | 10 NANOMETERS | 0.13 | 3.1 |
| LIGHT EMITTING LAYER | $\alpha$-PTD(50nm)/Alq3(50nm) | 100 NANOMETERS | 1.8 | 0 |
| SECOND TRANSPARENT ELECTRODE | ITO | 100 NANOMETERS | 1.8 | 0.007 |
| SECOND TRANSPARENT MEMBER | ACRYLIC RESIN SUBSTRATE | 500 MICROMETERS | 1.45 | 0 |

FIG.10

SHOWN IN THE ORDER OF MATERIAL (REFRACTIVE INDEX n, EXTINCTION COEFFICIENT κ)

| | FIRST TRANSPARENT MEMBER | FIRST TRANSPARENT ELECTRODE | LIGHT EMITTING LAYER | SECOND TRANSPARENT ELECTRODE | SECOND TRANSPARENT MEMBER |
|---|---|---|---|---|---|
| EXAMPLE5 | HIGH-REFRACTIVE-INDEX RESIN(1.8, 0) | Ag(0.13, 3.1) | Alq3(1.75, 0) | CONDUCTIVE RESIN (1.5, 0.08) | RESIN(1.5, 0) |
| EXAMPLE6 | HIGH-REFRACTIVE-INDEX RESIN(1.8, 0) | Al(0.89, 6.3) | Alq3(1.75, 0) | CONDUCTIVE RESIN (1.5, 0.08) | RESIN(1.5, 0) |
| EXAMPLE7 | HIGH-REFRACTIVE-INDEX RESIN(1.8, 0) | Cu(1.1, 2.6) | Alq3(1.75, 0) | CONDUCTIVE RESIN (1.5, 0.08) | RESIN(1.5, 0) |
| EXAMPLE8 | HIGH-REFRACTIVE-INDEX RESIN(1.8, 0) | Au(0.58, 2.2) | Alq3(1.75, 0) | CONDUCTIVE RESIN (1.5, 0.08) | RESIN(1.5, 0) |
| EXAMPLE9 | HIGH-REFRACTIVE-INDEX RESIN(1.8, 0) | MgAg(0.25, 4.3) | Alq3(1.75, 0) | CONDUCTIVE RESIN (1.5, 0.08) | RESIN(1.5, 0) |
| EXAMPLE10 | RESIN(1.5, 0) | Ag(0.13, 3.1) | Alq3(1.75, 0) | CONDUCTIVE RESIN (1.5, 0.08) | LOW-REFRACTIVE-INDEX RESIN(1.4, 0) |
| EXAMPLE11 | HIGH-REFRACTIVE-INDEX RESIN(1.8, 0) | Ag(0.13, 3.1) | Alq3(1.75, 0) | CONDUCTIVE RESIN (1.5, 0.08) | RESIN(1.5, 0) |
| EXAMPLE12 | RESIN(1.5, 0) | Ag(0.13, 3.1) | Alq3(1.75, 0) | CONDUCTIVE RESIN (1.5, 0.08) | RESIN IN WHICH HOLLOW SILICA PARTICLES ARE DISPERSED(1.1, 0) |
| EXAMPLE13 | TiO2(2.5, 0) | Ag(0.13, 3.1) | Alq3(1.75, 0) | CONDUCTIVE RESIN (1.5, 0.08) | RESIN(1.5, 0) |
| EXAMPLE14 | SiO2(1.5, 0) | Ag(0.13, 3.1) | Alq3(1.75, 0) | CONDUCTIVE RESIN (1.5, 0.08) | LOW-REFRACTIVE-INDEX RESIN(1.4, 0) |
| EXAMPLE15 | HIGH-REFRACTIVE-INDEX GLASS(1.8, 0) | Ag(0.13, 3.1) | Alq3(1.75, 0) | CONDUCTIVE RESIN (1.5, 0.08) | GLASS(1.5, 0) |
| EXAMPLE16 | TiO2(2.5, 0) | Ag(0.13, 3.1) | Alq3(1.75, 0) | CONDUCTIVE RESIN (1.5, 0.08) | HIGH-REFRACTIVE-INDEX GLASS(1.8, 0) |

FIG.11

SHOWN IN THE ORDER OF MATERIAL (REFRACTIVE INDEX n, EXTINCTION COEFFICIENT κ)

| | FIRST TRANSPARENT MEMBER | FIRST TRANSPARENT ELECTRODE | LIGHT EMITTING LAYER | SECOND TRANSPARENT ELECTRODE | SECOND TRANSPARENT MEMBER |
|---|---|---|---|---|---|
| EXAMPLE17 | HIGH-REFRACTIVE-INDEX RESIN(1.8, 0) | Ag(0.13, 3.1) | Alq3(1.75, 0) | ITO(1.8, 0.07) | RESIN(1.5, 0) |
| EXAMPLE18 | HIGH-REFRACTIVE-INDEX RESIN(1.8, 0) | Al(0.89, 6.3) | Alq3(1.75, 0) | ITO(1.8, 0.07) | RESIN(1.5, 0) |
| EXAMPLE19 | HIGH-REFRACTIVE-INDEX RESIN(1.8, 0) | Cu(1.1, 2.6) | Alq3(1.75, 0) | ITO(1.8, 0.07) | RESIN(1.5, 0) |
| EXAMPLE20 | HIGH-REFRACTIVE-INDEX RESIN(1.8, 0) | Au(0.58, 2.2) | Alq3(1.75, 0) | ITO(1.8, 0.07) | RESIN(1.5, 0) |
| EXAMPLE21 | HIGH-REFRACTIVE-INDEX RESIN(1.8, 0) | MgAg(0.25, 4.3) | Alq3(1.75, 0) | ITO(1.8, 0.07) | RESIN(1.5, 0) |
| EXAMPLE22 | RESIN(1.5, 0) | Ag(0.13, 3.1) | Alq3(1.75, 0) | ITO(1.8, 0.07) | LOW-REFRACTIVE-INDEX RESIN(1.4, 0) |
| EXAMPLE23 | HIGH-REFRACTIVE-INDEX RESIN(1.8, 0) | Ag(0.13, 3.1) | Alq3(1.75, 0) | ITO(1.8, 0.07) | RESIN(1.5, 0) |
| EXAMPLE24 | RESIN(1.5, 0) | Ag(0.13, 3.1) | Alq3(1.75, 0) | ITO(1.8, 0.07) | RESIN IN WHICH HOLLOW SILICA PARTICLES ARE DISPERSED(1.1, 0) |
| EXAMPLE25 | TiO2(2.5, 0) | Ag(0.13, 3.1) | Alq3(1.75, 0) | ITO(1.8, 0.07) | RESIN(1.5, 0) |
| EXAMPLE26 | SiO2(1.5, 0) | Ag(0.13, 3.1) | Alq3(1.75, 0) | ITO(1.8, 0.07) | LOW-REFRACTIVE-INDEX RESIN(1.4, 0) |
| EXAMPLE27 | HIGH-REFRACTIVE-INDEX GLASS(1.8, 0) | Ag(0.13, 3.1) | Alq3(1.75, 0) | ITO(1.8, 0.07) | GLASS(1.5, 0) |
| EXAMPLE28 | TiO2(2.5, 0) | Ag(0.13, 3.1) | Alq3(1.75, 0) | ITO(1.8, 0.07) | HIGH-REFRACTIVE-INDEX GLASS(1.8, 0) |

FIG.12

SHOWN IN THE ORDER OF MATERIAL (REFRACTIVE INDEX n, EXTINCTION COEFFICIENT κ)

| | FIRST TRANSPARENT MEMBER | FIRST TRANSPARENT ELECTRODE | LIGHT EMITTING LAYER | SECOND TRANSPARENT ELECTRODE | SECOND TRANSPARENT MEMBER |
|---|---|---|---|---|---|
| EXAMPLE29 | HIGH-REFRACTIVE-INDEX RESIN(1.8, 0) | PCBM(2.3, 0.25) | Alq3(1.75, 0) | PEDOT/PSS(1.5, 0.08) | RESIN(1.5, 0) |
| EXAMPLE30 | RESIN(1.5, 0) | PCBM(2.3, 0.25) | Alq3(1.75, 0) | PEDOT/PSS(1.5, 0.08) | LOW-REFRACTIVE-INDEX RESIN(1.4, 0) |
| EXAMPLE31 | HIGH-REFRACTIVE-INDEX RESIN(1.8, 0) | PCBM(2.3, 0.25) | Alq3(1.75, 0) | PEDOT/PSS(1.5, 0.08) | RESIN(1.5, 0) |
| EXAMPLE32 | RESIN(1.5, 0) | PCBM(2.3, 0.25) | Alq3(1.75, 0) | PEDOT/PSS(1.5, 0.08) | RESIN IN WHICH HOLLOW SILICA PARTICLES ARE DISPERSED(1.1, 0) |
| EXAMPLE33 | TiO2(2.5, 0) | PCBM(2.3, 0.25) | Alq3(1.75, 0) | PEDOT/PSS(1.5, 0.08) | RESIN(1.5, 0) |
| EXAMPLE34 | SiO2(1.5, 0) | PCBM(2.3, 0.25) | Alq3(1.75, 0) | PEDOT/PSS(1.5, 0.08) | LOW-REFRACTIVE-INDEX RESIN(1.4, 0) |
| EXAMPLE35 | HIGH-REFRACTIVE-INDEX GLASS(1.8, 0) | PCBM(2.3, 0.25) | Alq3(1.75, 0) | PEDOT/PSS(1.5, 0.08) | GLASS(1.5, 0) |
| EXAMPLE36 | TiO2(2.5, 0) | PCBM(2.3, 0.25) | Alq3(1.75, 0) | PEDOT/PSS(1.5, 0.08) | HIGH-REFRACTIVE-INDEX GLASS(1.8, 0) |

FIG.13
| MATERIAL | REFRACTIVE INDEX | MATERIAL | REFRACTIVE INDEX |
|---|---|---|---|
| L-BAL35 | 1.59 | L-LAH85 | 1.85 |
| L-BSL7 | 1.52 | L-PHL1 | 1.56 |
| L-TIM28 | 1.69 | L-TIH53 | 1.85 |
| L-LAM72 | 1.73 | L-NBH54 | 1.9 |
| L-LAH81 | 1.81 | S-FPL51 | 1.5 |
FIG.14
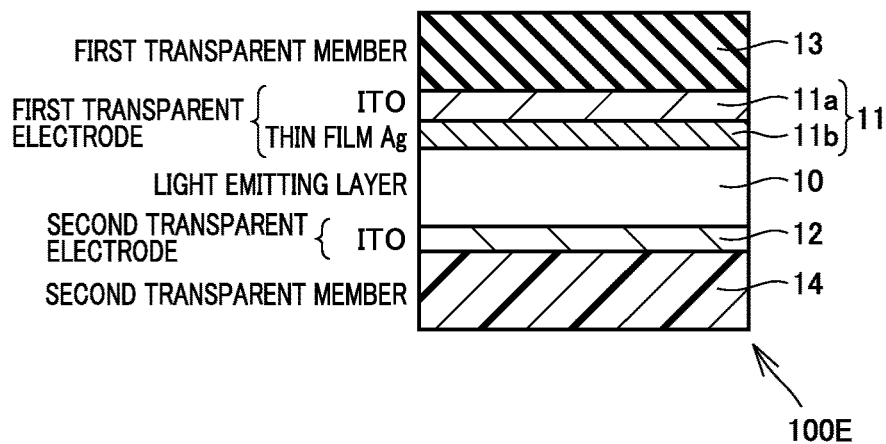
FIG.15
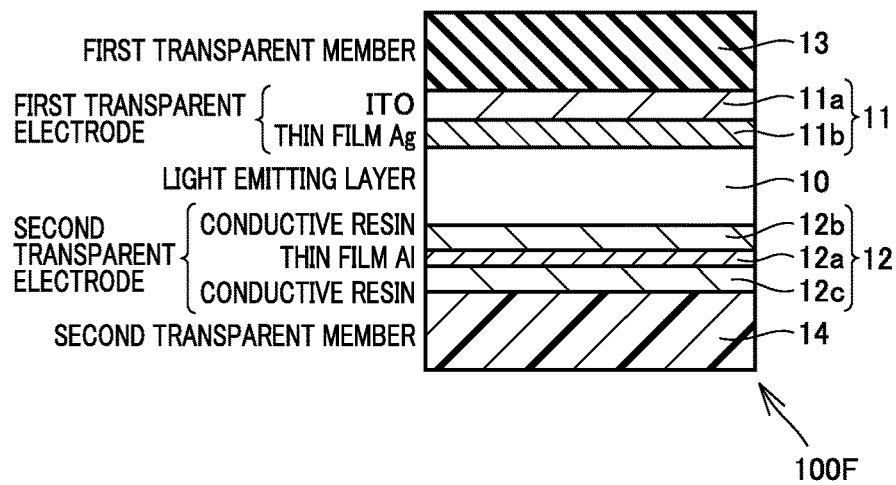

100G

100H

ELECTROLUMINESCENT ELEMENT AND LIGHTING APPARATUS COMPRISING THE SAME

This is the U.S. national stage of application No. PCT/JP2013/061239, filed on Apr. 16, 2013. Priority under 35 U.S.C. §119(a) and 35 U.S.C. §365(b) is claimed from Japanese Application No. 2012-134789, filed Jun. 14, 2012, the disclosure of which is also incorporated herein by reference.

TECHNICAL FIELD

This invention relates to an electroluminescent element and a lighting apparatus including the electroluminescent element.

BACKGROUND ART

In recent years, surface light sources with high luminous efficiency that include electroluminescent elements such as light emitting diodes (LEDs: Light Emitting Diodes), organic EL (Electro-Luminescence), and the like have attracted attention. An electroluminescent element is formed of a light emitting layer sandwiched between a flat cathode and a flat anode. Generally, the anode is often formed of a transparent electrode, and the cathode is often formed of a metal reflective electrode. When the cathode is formed of a metal reflective electrode, light is extracted through the transparent anode, and such an electroluminescent element is used as a single surface emission-type light emitting device.

Japanese Laid-Open Patent Publication No. 10-294182 (PTD 1), Japanese Laid-Open Patent Publication No. 2012-15122 (PTD 2), and Japanese Laid-Open Patent Publication No. 2011-65781 (PTD 3) disclose electroluminescent elements used as transparent surface-emission light sources, in which transparent electrodes are used for both a cathode and an anode.

In such an electroluminescent element in which transparent electrodes are used for both a cathode and an anode, plasmon absorption loss that occurs when a metal reflective electrode is used on one side is reduced, and thus, a more efficient electroluminescent element can be realized. Such a transparent electroluminescent element can have a variety of designs, and is suitable for making the space seem expansive.

CITATION LIST

Patent Document

PTD 1: Japanese Laid-Open Patent Publication No. 10-294182
PTD 2: Japanese Laid-Open Patent Publication No. 2012-15122
PTD 3: Japanese Laid-Open Patent Publication No. 2011-65781

SUMMARY OF INVENTION

Technical Problem

Such an electroluminescent element, when used as a surface-emission light source for lighting, desirably illuminates the space evenly. It is therefore important to make the luminous intensities of a front surface and a rear surface of the electroluminescent element approximately equal to each other, and ensure transparency without light scattering.

Patent documents 1, 2 and 3 above are silent about a difference in luminous intensity between the front surface and the rear surface of an electroluminescent element, and are thus unclear as to the method of making the luminous intensities of the front surface and the rear surface of a light emitting device itself approximately equal to each other.

In consideration of electrical properties such as an electron transport property, a hole transport property, and the like, it is useful to use materials having different work functions for the cathode and the anode of an electroluminescent element, so as to increase the luminous efficiency.

However, when different materials are used for the cathode and the anode of an electroluminescent element, optical reflectances of the interfaces between the light emitting layer and the respective electrodes differ between the cathode side and the anode side, because of a difference in electron transport performance, although patent documents 1, 2 and 3 above fail to mention this as a problem. Consequently, luminous intensities differ between the front surface and the rear surface of the electroluminescent element.

The present invention was made to solve the aforementioned problem, and an object of the invention is to provide an electroluminescent element capable of exhibiting approximately equal luminous intensities of a front surface and a rear surface of the electroluminescent element, and also ensuring transparency, as well as provide a lighting apparatus including the electroluminescent element.

Solution to Problem

An electroluminescent element based on this invention includes a first transparent electrode, a second transparent electrode, a light emitting layer sandwiched between the first transparent electrode and the second transparent electrode, a first transparent member formed on a surface of the first transparent electrode opposite to the light emitting layer, and a second transparent member formed on a surface of the second transparent electrode opposite to the light emitting layer.

Refractive indices of the first transparent electrode and the second transparent electrode are selected such that as seen from the light emitting layer, a reflectance of an interface between the light emitting layer and the first transparent electrode becomes higher than a reflectance of an interface between the light emitting layer and the second transparent electrode, and the refractive index of the first transparent member is set to be higher than a refractive index of the second transparent member.

Advantageous Effects of Invention

According to this invention, an electroluminescent element capable of exhibiting approximately equal luminous intensities of a front surface and a rear surface of the electroluminescent element, and also ensuring transparency, as well as and a lighting apparatus including the electroluminescent element, can be provided.

BRIEF DESCRIPTION OF DRAWINGS

FIG. 7 is a diagram showing a cross-sectional structure of an organic electroluminescent element according to Example 3 based on the second embodiment.

FIG. 8 is a diagram showing a cross-sectional structure of an organic electroluminescent element according to Example 4 based on the second embodiment.

FIG. 9 is a diagram showing refractive indices and extinction coefficients of the first transparent member, the first transparent electrode, the light emitting layer, the second transparent electrode, and the second transparent member in an organic electroluminescent element according to Example 4 based on the second embodiment.

FIG. 10 is a diagram showing refractive indices of the first transparent member, the first transparent electrode, the light emitting layer, the second transparent electrode, and the second transparent member in an organic electroluminescent element according to each of Examples 5 to 16 based on the second embodiment.

FIG. 11 is a diagram showing refractive indices of the first transparent member, the first transparent electrode, the light emitting layer, the second transparent electrode, and the second transparent member in an organic electroluminescent element according to each of Examples 17 to 28 based on the second embodiment.

FIG. 12 is a diagram showing refractive indices of the first transparent member, the first transparent electrode, the light emitting layer, the second transparent electrode, and the second transparent member in an organic electroluminescent element according to each of Examples 29 to 36 based on the second embodiment.

FIG. 13 is a diagram showing (ten types of) glass materials usable as materials of the first transparent member or the second transparent member.

FIG. 14 is a diagram showing a cross-sectional structure of an organic electroluminescent element according to Example 37 based on the second embodiment.

FIG. 15 is a diagram showing a cross-sectional structure of an organic electroluminescent element according to Example 38 based on the second embodiment.

DESCRIPTION OF EMBODIMENTS

Figure 1:
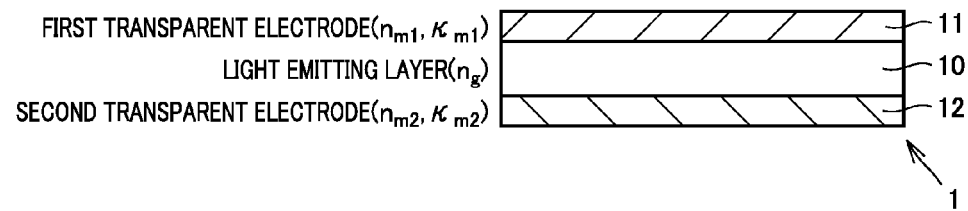
FIG. 1 is a cross-sectional view corresponding to a cross section seen along line 1-1 indicated by the arrows in FIG. 2, showing a minimum structure to realize an electroluminescent element.

Electroluminescent elements according to various embodiments and examples based on the present invention, as well as a lighting apparatus including any of the electroluminescent elements will be described hereinafter, referring to the drawings. When reference is made to a number, an amount or the like in the following description of the various embodiments, the scope of the present invention is not necessarily limited to the number, the amount or the like, unless otherwise specified. Identical or corresponding components are indicated by identical reference numbers, and the same description may not be repeated. It is originally intended to use appropriate combinations of features in the various embodiments. In the figures, n denotes a refractive index of each layer, and κ denotes an extinction coefficient of each layer.

(Minimum Structure to Realize Electroluminescent Element)

Figure 2:
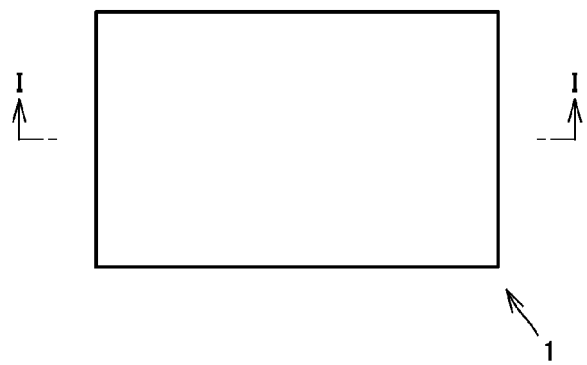
FIG. 2 is a plan view of the electroluminescent element.

FIGS. 1 and 2 show a minimum structure to realize electroluminescent element 1. FIG. 1 is a cross-sectional view of electroluminescent element 1, which corresponds to a cross section seen along line 1-1 indicated by the arrows in FIG. 2. FIG. 2 is a plan view of electroluminescent element 1.

Electroluminescent element 1 includes a first transparent electrode 11, a second transparent electrode 12, and a light emitting layer 10 sandwiched between first transparent electrode 11 and second transparent electrode 12. When voltage is applied between first transparent electrode 11 and second transparent electrode 12, electrons are accelerated and injected into light emitting layer 10, and the electron kinetic energy is converted into photons at light emitting layer 10. Light thereby exits toward first transparent electrode 11 and second transparent electrode 12.

Generally, to facilitate electron injection, different materials are used for first transparent electrode 11 and second transparent electrode 12. For example, a thin-film metal electrode with a work function suitable for electron injection (Ag, Al, Au, Cu, etc.) is used as a cathode, and a transparent oxide semiconductor electrode with a work function suitable for hole injection (ITO (a mixture of indium oxide and tin oxide), IZO (a mixture of indium oxide and zinc oxide), etc.) is used as an anode.

The thin-film metal electrode has an excellent electron transport property, but has low optical transmittance. Thus, when the thin-film metal electrode is used as a transparent electrode, a suitable thickness thereof is from several to several tens of nanometers to increase the transmittance. The transparent oxide semiconductor electrode is characterized by a large surface resistance per thickness and a high transmittance, as compared to the thin-film metal electrode.

Thus, when the transparent oxide semiconductor is used as an electrode, a suitable thickness thereof is from 10 nm to 200 nm to reduce the surface resistance.

If the same type of transparent electrode is used for first transparent electrode 11 and second transparent electrode 12, the electron injection performance will deteriorate, and the drive voltage will increase to lower the luminous efficiency, which is undesirable. It is therefore desirable to use different materials for first transparent electrode 11 and second transparent electrode 12, to provide one transparent electrode with a good electron injection property, and the other transparent electrode with a good hole injection property.

When different electrode materials are used for first transparent electrode 11 and second transparent electrode 12, it is necessary to take into account reflectances of light at the interfaces between light emitting layer 10 and the respective transparent electrodes. Reflectances differ between first transparent electrode 11 and second transparent electrode 12.

Figure 3:
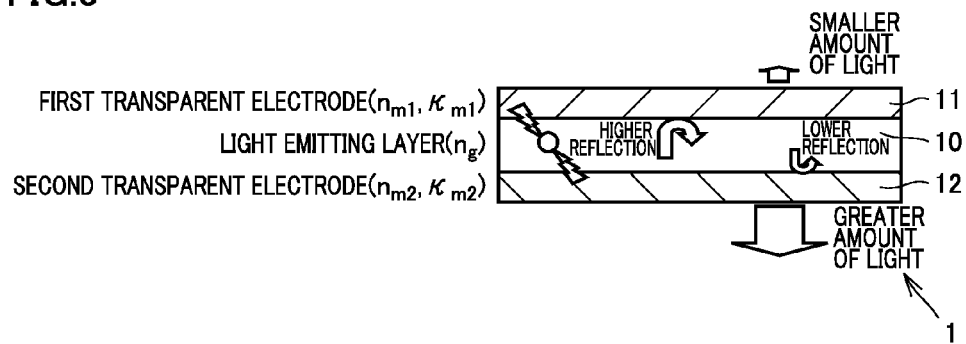
FIG. 3 is a schematic diagram for explaining a difference in luminous intensity due to a difference in reflectance of light at the interface between the light emitting layer and each transparent electrode.

This will now be described with FIG. 3. FIG. 3 is a schematic diagram for explaining a difference in luminous intensity due to a difference in reflectance of light at the interface between light emitting layer 10 and each transparent electrode. We consider, for example, a case where the reflectance of first transparent electrode 11 is high and the reflectance of second transparent electrode 12 is low, as shown in FIG. 3.

Figure 24:
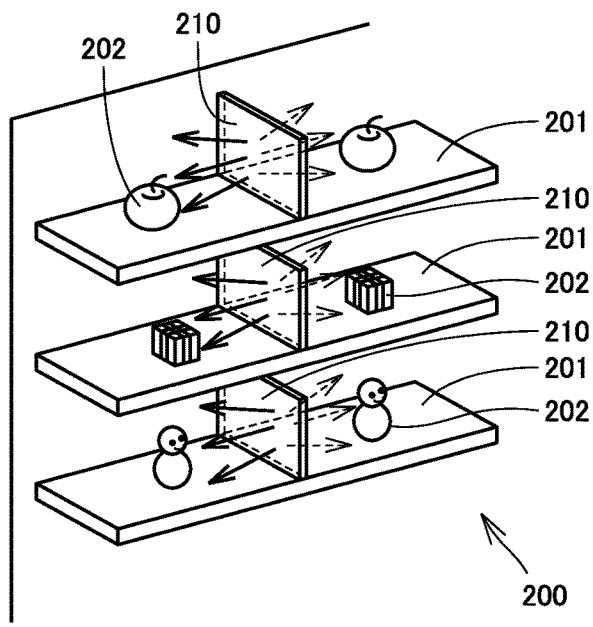
FIG. 24 is a diagram showing a schematic structure of a lighting apparatus according to a third embodiment.

As a consequence of multi-reflections, the amount of light extracted outside through first transparent electrode 11 is small, and only the amount of light extracted outside through second transparent electrode 12 is great. For example, in consideration of application to the below-described lighting apparatus as shown in FIG. 24, it is desirable that the intensity of light extracted outside through first transparent electrode 11 and the intensity of light extracted outside through second transparent electrode 12 be approximately equal to each other.

It is thus not desirable to use the same materials for first transparent electrode 11 and second transparent electrode 12, from the viewpoint of the electron injection property.

Each of the embodiments described below was made in view of this problem, and intends to make the intensity of light extracted outside through first transparent electrode 11 and the intensity of light extracted outside through second transparent electrode 12 approximately equal to each other, by means of a simple structure. Electroluminescent elements according to embodiments of the invention and a lighting apparatus including such electroluminescent elements will be described hereinafter.

First Embodiment

Electroluminescent Element 100A

Figure 4:
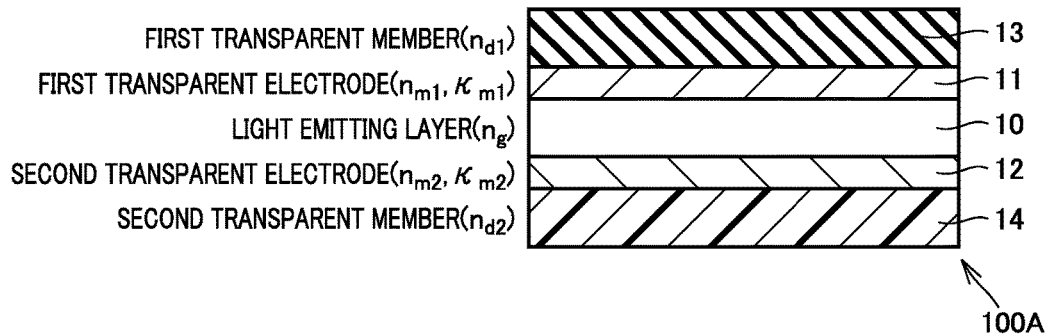
FIG. 4 is a cross-sectional view of an electroluminescent element according to Example 1 based on a first embodiment.
Figure 5:
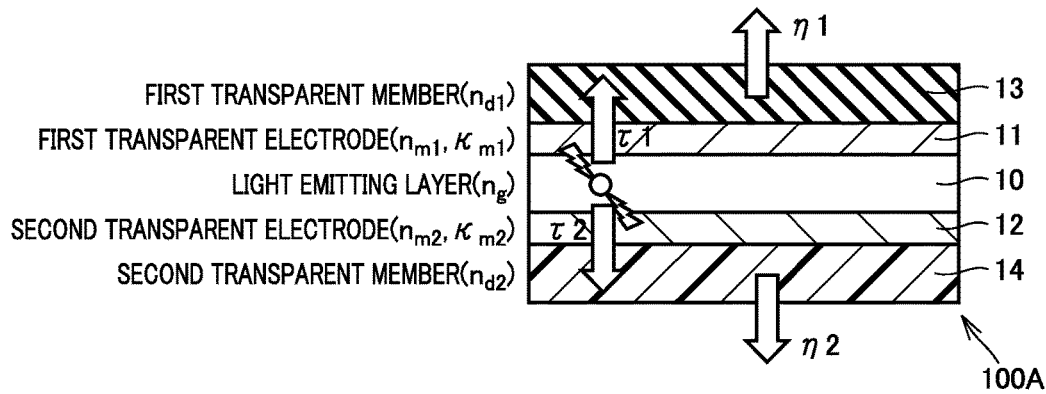
FIG. 5 is a schematic diagram for explaining a difference in luminous intensity due to a difference in reflectance of light at the interface between the light emitting layer and each transparent electrode of the electroluminescent element according to Example 1 based on the first embodiment.

Referring to FIGS. 4 and 5, electroluminescent element 100A as Example 1 based on the first embodiment will be described hereinafter. FIG. 4 is a cross-sectional view of electroluminescent element 100A according to this Example, and FIG. 5 is a schematic diagram for explaining a difference in luminous intensity due to a difference in reflectance of light at the interface between the light emitting layer and each transparent electrode of electroluminescent element 100A according to this Example. The cross section in FIG. 4 corresponds to the cross section seen along the line I-I indicated by the arrows in FIG. 2.

Electroluminescent element 100A according to this Example includes first transparent electrode 11, second transparent electrode 12, and light emitting layer 10 sandwiched between first transparent electrode 11 and second transparent electrode 12. A first transparent member 13 is formed on a surface of first transparent electrode 11 opposite to light emitting layer 10. A second transparent member 14 is formed on a surface of second transparent electrode 12 opposite to light emitting layer 10.

Refractive indices of first transparent electrode 11 and second transparent electrode 12 are selected such that as seen from light emitting layer 10, a reflectance of an interface between light emitting layer 10 and first transparent electrode 11 becomes higher than a reflectance of an interface between light emitting layer 10 and second transparent electrode 12. The refractive index of first transparent member 13 is set to be higher than the refractive index of second transparent member 14.

As described with FIG. 3, without first transparent member 13 and second transparent member 14, intense light is emitted only from second transparent electrode 12. In contrast, by providing first transparent member 13 and second transparent member 14 described above, as shown in this Example, luminous intensities of first transparent member 13 and second transparent member 14 can be made approximately equal to each other. The following describes a principle thereof.

A thickness of the basic electroluminescent element sandwiched between second transparent electrode 12 and first transparent electrode 11 (light emitting layer 10 plus first transparent electrode 11 plus second transparent electrode 12) is typically set within the range from about 100 nm to 500 nm, so as to increase electric field strength against applied voltage, and prevent a voltage decrease due to an internal resistance.

The quantum theory of light can be used to describe how the light emitted from the optical thin films having a thickness that is approximately not greater than an optical wavelength to several times greater than the wavelength is distributed to first transparent member 13 and second transparent member 14. Effects attained in this Example will be described herein referring to the following document [1].

Document [1]: Rodney Loudon, "The Quantum Theory of Light (Second edition)" (*Hikari no ryoshi-ron*, translated by Tadanori Kojima and Kazuko Kojima, "*Hikari no ryoshi-ron*, second edition", Uchida Rokakuho (1994)).

In electroluminescent element 100A shown in FIG. 4, τ1 denotes the time required for transition of light emitted at light emitting layer 10 to first transparent member 13, and τ2 denotes the time required for transition of light emitted at light emitting layer 10 to second transparent member 14.

Based on document [1], τ1 and τ2 can be expressed by the following (Equation 1), using an approximately common factor of proportionality:

$$1/\tau_1 = G n_{d1}^3$$

$$1/\tau_2 = G n_{d2}^3 \tag{Equation 1}$$

where G is a constant dependent on the electric field distribution of radiant light, $n_{d1}$ is the refractive index of first transparent member 13, and $n_{d2}$ is the refractive index of second transparent member 14.

From here, when N number of photons is generated, a ratio of the number of photons $N_1$ distributed to first transparent member 13 relative to the number of photons $N_2$ distributed to second transparent member 14 can be calculated in accordance with the following (Equation 2):

$$\begin{cases} p_1 = \dfrac{1/\tau_1}{1/\tau_1 + 1/\tau_2} = \dfrac{n_{d1}^3}{n_{d1}^3 + n_{d2}^3} \\ p_2 = \dfrac{1/\tau_2}{1/\tau_1 + 1/\tau_2} = \dfrac{n_{d2}^3}{n_{d1}^3 + n_{d2}^3} \end{cases}$$ (Equation 2)

$$\begin{cases} N_1 = p_1 N \\ N_2 = p_1 N \end{cases}$$

$$\Rightarrow \dfrac{N_1}{N_2} = \dfrac{n_{d1}^3}{n_{d2}^3}$$

where $P_1$ is the probability that the photons generated will move to first transparent member 13, and $P_2$ is the probability that the photons generated will move to second transparent member 14.

This is derived from the result that in the wave number space representing undulatory states of light, the density of states is proportional to the third power of the refractive index, and from the theory that the transition probability of light is determined by the ratio of the density of states. In other words, this means that photons tend to move to a space with a high density of states, and the density of states of light is proportional to the third power of the refractive index of light.

To sufficiently increase the density of states of light, it is desirable that the thickness of a transparent member be greater than an optical wavelength in the transparent member (when the vacuum wavelength is denoted as $\lambda_0$, the wavelength of first transparent member 13 is denoted as $\lambda_0/n_{d1}$, and the wavelength of second transparent member 14 is denoted as $\lambda_0/n_{d2}$).

First transparent member 13 and second transparent member 14 preferably have a thickness of approximately several hundred micrometers, in order to increase the mechanical strength of the light emitting device. Here, an optical behavior in each transparent member can be approximated by geometrical optics.

An angular distribution of light that has traveled from the light emitting layer to the transparent member can be approximated by the Lambert (cos θ orientation). In this case, a ratio $\eta_1$ of light that exits to the air with a refractive index of 1 from first transparent member 13 with refractive index $n_{d1}$, and a ratio $\eta_2$ of light that exits to the air with a refractive index of 1 from second transparent member 14 with refractive index $n_{d2}$, can be represented by the following equations (Equation 3):

$$\eta_1 = \dfrac{1}{n_{d1}^2} \quad \eta_2 = \dfrac{1}{n_{d2}^2}$$ (Equation 3)

(Equation 3) can be obtained by performing the integration of a beam of light, by estimating the orientation using the Lambert, and assuming that the light within the total reflection angle all exits to the air. From (Equation 1) and (Equation 3), a ratio of the number of photons $M_2$ that exit to the air through second transparent member 14 relative to the number of photons $M_1$ that exit to the air through first transparent member 13 can be represented by the following (Equation 4):

$$\dfrac{M_2}{M_1} = \dfrac{\eta_1 N_1}{\eta_2 N_2} = \dfrac{n_{d2}}{n_{d1}}$$ (Equation 4)

This means that the number of photons $M_1$ that exit through first transparent member 13 is proportional to refractive index $n_{d1}$ of first transparent member 13, and the number of photons $M_2$ that exit through second transparent member 14 is proportional to refractive index $n_{d2}$ of second transparent member 14.

In an actual element, not all photons reach the air, and the ratio of photons that disappear is determined depending on the reflectances and the transmittances of the transparent electrodes described above. For example, when the reflectance of first transparent member 13 is higher than the reflectance of second transparent member 14, $M_2$ increases over the ratio represented by (Equation 4).

It is of importance in this embodiment that the difference in the number of photons between the front surface and the rear surface due to the difference in electrode reflectance can be canceled out by the refractive indices of the transparent members, as shown in (Equation 4).

We consider, for example, a situation in which when first transparent member 13 and second transparent member 14 are not provided, the reflectance of first transparent electrode 11 seen from light emitting layer 10 is higher than the reflectance of second transparent electrode 12 seen from light emitting layer 10. As a consequence of multi-reflections, the amount of light that exits outside through second transparent electrode 12 is larger than the amount of light that exits outside through first transparent electrode 11. We assume that a ratio of light $L_2$ that exits through second transparent electrode 12 relative to light $L_1$ that exits through first transparent electrode 11 is $L_2/L_1=1.14$.

Here in this Example, we consider a case where a material with a refractive index of 1.65 is used as first transparent member 13 on an outer side of first transparent electrode 11, and a material with a refractive index of 1.45 is used as second transparent member 14.

While examples of materials may include a glass material, a resin material, a semiconductor oxide, a metal oxide, and the like, any other transparent materials may also be used such as a rubber, a liquid, a gas, a gel, and the like. An example of a medium having a high refractive index for visible light may be $TiO_2$ (refractive index 2.5), and an example of a material with a low refractive index may be a resin medium in which hollow silica particles are dispersed (refractive index 1.1). In this case, the ratio of the number of photons varies in accordance with (Equation 4). Consequently, a ratio of light $L_2'$ that exits outside through second transparent member 14 relative to light $L_1'$ that exits outside through first transparent member 13 can be made equal to each other, as shown in the following (Equation 5):

$$\dfrac{L_2'}{L_1'} = \dfrac{n_{d2}}{n_{d1}} \times 1.14 = \dfrac{1.45}{1.65} \times 1.14 = 1.0$$ (Equation 5)

In electroluminescent element 100A according to this Example, therefore, the ratio of light that exits through second transparent electrode 12 relative to light that exits through first transparent electrode 11 can be made approximately equal to each other, by controlling the refractive indices of first transparent member 13 and second transparent member 14, as shown in FIG. 5.

Second Embodiment

An electroluminescent element based on this embodiment will be described below, referring to a more specific example. A case where an organic electroluminescent element (organic EL) that emits in the visible light region (wavelength: 400 nm to 800 nm) will be described as a specific structure.

This Example is not limited to organic EL that emits in the visible region, and is common to every electroluminescent element in which the light emitting layer is sandwiched between transparent electrodes, for example, an inorganic electroluminescent element or an infrared emitting element.

(Organic Electroluminescent Elements 100B, 100C, 100D)

Figure 6:
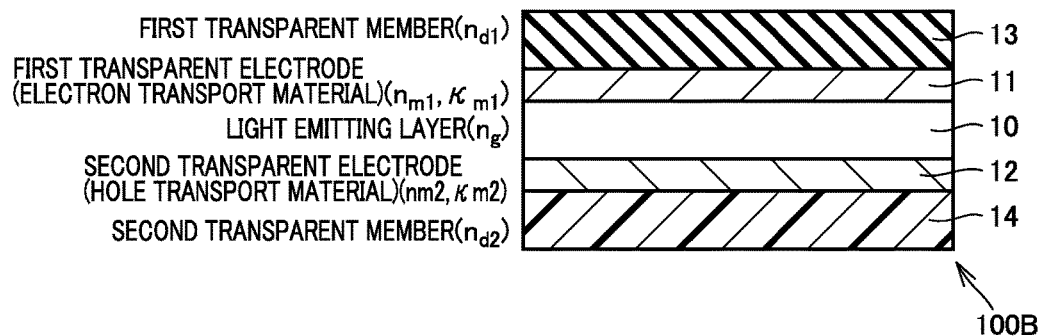
FIG. 6 is a diagram showing a cross-sectional structure of an organic electroluminescent element according to Example 2 based on a second embodiment.

FIG. 6 shows organic electroluminescent element 100B as Example 2, FIG. 7 shows organic electroluminescent element 100C as Example 3, and FIG. 8 shows organic electroluminescent element 100D as Example 4. FIGS. 6 to 8 are diagrams showing cross-sectional structures of organic electroluminescent elements 100B to 100D.

Referring to organic electroluminescent element 100B in FIG. 6, a specific structure is shown in which a metal thin film with a good electron injection property is used as first transparent electrode 11, and a transparent oxide semiconductor with a good hole injection property is used as second transparent electrode 12. In this case, first transparent electrode 11 serves as the cathode, and second transparent electrode 12 serves as the anode.

Refractive indices of first transparent electrode 11 and second transparent electrode 12 are set such that a reflectance of an interface between light emitting layer 10 and first transparent electrode 11 seen from light emitting layer 10 becomes higher than a reflectance of an interface between light emitting layer 10 and second transparent electrode 12 seen from light emitting layer 10.

Any known fluorescent material or phosphorescent material can be used as an organic EL material for light emitting layer 10. Furthermore, as required, a hole transport layer may be formed on the anode of light emitting layer 10, and an electron transport layer may be formed on the cathode of light emitting layer 10.

With regard to the material of light emitting layer 10, an organic metal complex is preferably used as the material for the organic EL element, from the viewpoint of enhancing the external quantum efficiency of the element, and from the viewpoint of advantageously attaining an effect such as an extended luminescent life or the like. The metal involving the complex formation is preferably any one metal belonging to group 8 to group 10 of the periodic table of the elements, preferably Al or Zn, and the above-mentioned metal is particularly preferably Ir, Pt, Al, or Zn.

In the organic EL shown in FIG. 6, first transparent electrode 11 is made of an electron transport material, and second transparent electrode 12 is made of a hole transport material. A structure suitable for electron injection can be made by adopting such a structure.

Here, a material with a good electron injection property tends to have a high reflectance because electrons easily oscillate therein owing to its good electrical conductivity. This leads to the problem of uneven emission of light as shown in FIG. 3. In this embodiment, however, as described above, since the refractive index of first transparent member 13 is set to be higher than that of second transparent member 14, the luminous intensities of both surfaces can be made approximately equal to each other while maintaining the good electron injection property, owing to the effect described with (Equation 4).

A material with a good electron injection property is known to have a smaller refractive index because of good oscillations of electrons. This will now be described in a little more detail based on electromagnetism. How electrons in the medium respond to an electric field can be represented by a real part of complex relative permittivity. Complex relative permittivity $\in_c$ is an optical constant related to interface reflection, and is a physical amount represented by (Equation 6), using refractive index n and extinction coefficient κ:

$$\in_c = (n^2 - \kappa^2) + 2in\kappa$$

$$P = (\in_c - \in_0)E \qquad \text{(Equation 6)}$$

where P and E are polarization and electric field, respectively, and $\in_0$ is the dielectric constant in vacuum.

That is, it is observed that the real part of complex relative permittivity $\in_c$ decreases as the refractive index n becomes smaller and the extinction coefficient κ becomes larger.

This reveals a phase shift in the polarization response due to oscillations of electrons with respect to oscillations of the electric field. Hence, as described above, as the refractive index n becomes smaller and the extinction coefficient κ becomes larger, the better the electrons oscillate in the material, and a material with a high electron transport property tends to have a small refractive index n and a large extinction coefficient κ.

In a metal electrode, in particular, n is approximately 0.1, whereas the extinction coefficient κ has a large value from 2 to 10, and the rate of change depending on the wavelength is also high. Thus, even if n is the same value, the value of the extinction coefficient κ may vary greatly, which may often result in a large difference in electron transport performance.

Therefore, when the refractive index of first transparent electrode 11 is denoted as $n_{m1}$, the extinction coefficient of first transparent electrode 11 is denoted as is $\kappa_{m1}$, the refractive index of the light emitting layer is denoted as $n_g$, the refractive index of second transparent electrode 12 is denoted as $n_{m2}$, and the extinction coefficient of second transparent electrode 12 is denoted as $\kappa_{m2}$, the refractive indices for realizing efficient electron injection satisfy the following (Equation 7):

$$n_{m1} \le n_g \le n_{m2}$$

and $$\kappa_{m1} > \kappa_{m2} \qquad \text{(Equation 7)}$$

A reflectance, which affects the optical characteristics, can be estimated using the Fresnel reflection coefficient at the interface. Fresnel coefficient $F_1$ at the interface between light emitting layer 10 and first transparent electrode 11 and Fresnel coefficient $F_2$ at the interface between light emitting layer 10 and second transparent electrode 12 are represented by the following (Equation 8):

$$F_1 = \frac{(n_{m1} - n_g)^2 + \kappa_{m1}^2}{(n_{m1} + n_g)^2 + \kappa_{m1}^2}$$

$$F_2 = \frac{(n_{m2} - n_g)^2 + \kappa_{m2}^2}{(n_{m2} + n_g)^2 + \kappa_{m2}^2}$$

(Equation 8)

As in the above, the refractive index of first transparent member 13 is denoted as $n_{d1}$, the refractive index of second transparent member 14 is denoted as $n_{d2}$, the refractive index of first transparent electrode 11 is denoted as $n_{m1}$, the extinction coefficient of first transparent electrode 11 is denoted as $\kappa_{m1}$, the refractive index of light emitting layer 10 is denoted as $n_g$, the refractive index of second transparent electrode 12 is denoted as $n_{m2}$, and the extinction coefficient of second transparent electrode 12 is denoted as $\kappa_{m2}$. FIG. 7 shows a cross-sectional structure of organic electroluminescent element 100C as Example 3.

The condition that as seen from light emitting layer 10, the reflectance of the interface between light emitting layer 10 and first transparent electrode 11 is higher than the reflectance of the interface between light emitting layer 10 and second transparent electrode 12 can be estimated by the following (Equation 9), based on $F_1 > F_2$ using the Fresnel coefficients in (Equation 8):

$$\frac{(n_{m1} - n_g)^2 + \kappa_{m1}^2}{(n_{m1} + n_g)^2 + \kappa_{m1}^2} > \frac{(n_{m2} - n_g)^2 + \kappa_{m2}^2}{(n_{m2} + n_g)^2 + \kappa_{m2}^2} \quad \text{(Equation 9)}$$

If another thin film is present in the periphery, the reflectances will differ from the Fresnel coefficients estimated by (Equation 9). For a strict calculation, a numerical analysis method such as a transfer matrix method, a rigorous coupled wave analysis (RCWA) method, a finite-difference time-domain (FDTD) method, or the like may be used.

It is of importance in this embodiment that the refractive indices of first transparent electrode 11 and second transparent electrode 12 are set such that the reflectance of the interface between light emitting layer 10 and first transparent electrode 11 seen from light emitting layer 10 becomes higher than the reflectance of the interface between light emitting layer 10 and second transparent electrode 12 seen from light emitting layer 10. The Fresnel coefficients are not an essential part of this embodiment.

However, (Equation 9) is useful in calculating a relational condition of refractive indices according to this embodiment through a simple method. On the other hand, in this embodiment, the relation between refractive index $n_{d1}$ of first transparent member 13 and refractive index $n_{d2}$ of second transparent member 14 is represented by the following (Equation 10):

$$n_{d1} > n_{d2} \quad \text{(Equation 10)}$$

Thus, a layered structure that satisfies both (Equation 9) and (Equation 10) is a condition for desired refractive indices to implement this embodiment.

In organic electroluminescent elements 100B and 100C according to this embodiment, the intensity of light extracted through first transparent electrode 11 and the intensity of light extracted through second transparent electrode 12 can be made approximately equal to each other, while maintaining the electron injection property.

(Organic Electroluminescent Element 100D)

With FIG. 8, the refractive indices and the thicknesses of materials, as well as the reflectances of the interfaces between the light emitting layer and the transparent electrodes, for organic electroluminescent element 100D as Example 4, will be described in detail using specific values.

When an organic material is used as light emitting layer 10, it typically has a refractive index between 1.6 to 1.8 in the visible light region. We consider here a case where Alq3 (thickness: 50 nm) and a hole transport layer ($\alpha$-NPD, thickness: 50 nm) that emit at a central wavelength of 520 nm are used as materials of light emitting layer 10. Alq3 is tris(8-quinolinolato)aluminum, and $\alpha$-NPD is 4,4'-bis[N-(1-naphthyl)-N-phenylamino]biphenyl. Light emitting layer 10 has an average refractive index of 1.8 at the wavelength of 520 nm Examples of materials used for the respective members and refractive indices thereof at the wavelength of 520 nm will be described. A high-refractive-index resin film (epoxy-based resin) with a refractive index of 1.65 is used as first transparent member 13, and a resin film (acrylic resin) with a refractive index of 1.45 is used as second transparent member 14.

Ag (refractive index n=0.13, extinction coefficient $\kappa$=3.1) serving as a thin-film metal electrode is used as first transparent electrode 11, and ITO (refractive index n=1.8, extinction coefficient $\kappa$=0.007) serving as a metal oxide electrode is used as second transparent electrode 12.

A specific procedure for preparation is as follows. A resin substrate with a refractive index of 1.5 is provided as second transparent member 14, and a 100-nm thick ITO thin film is formed thereon as second transparent electrode 12. As light emitting layer 10, $\alpha$-NPD (50 nm) and Alq3 (50 nm) are formed in order on second transparent electrode 12. As a hole transport layer, $\alpha$-NPD is formed between second transparent electrode 12 and Alq3, and first transparent electrode 11 is formed on Alq3.

Next, an Ag electrode made of a thin film (thickness: 20 nm) is formed as first transparent electrode 11. A seal is then provided with a high-refractive-index resin film (epoxy-based resin) as first transparent member 13. As required, an electrode extraction step may be provided in each step to withdraw an electrode terminal outside.

The refractive indices and the extinction coefficients of first transparent member 13, first transparent electrode 11, light emitting layer 10, second transparent electrode 12, and second transparent member 14 in organic electroluminescent element 100D shown in FIG. 8 are as shown in FIG. 9. The conditions shown in (Equation 9) and (Equation 10) according to this embodiment are satisfied. The conditions of refractive index (Equation 7) and (Equation 8) suitable for electron injection are also satisfied.

Therefore, with the structure of organic electroluminescent element 100D shown in FIGS. 8 and 9, an organic electroluminescent element can be realized that exhibits a more approximately equal ratio of the luminous intensities of both surfaces than cases without using the transparent members, while enhancing the electron injection performance.

In the organic electroluminescent element according to this embodiment, it is important to combine the refractive indices of the respective transparent electrodes and the respective transparent members. Materials usable as the transparent members will be described hereinafter. Examples of materials as transparent dielectric materials may include $TiO_2$ (refractive index n=2.5), $SiO_x$ (refractive index n=1.4 to 3.5), and the like.

Other examples of dielectric materials may include diamond, calcium fluoride (CaF), silicon nitride ($Si_3N_4$), and the like. As a glass material usable as a transparent member, a commercial product with a refractive index of 1.4 to 1.8 is known.

Resin materials may also be used such as, for example, vinyl chloride, acrylic, polyethylene, polypropylene, polystyrene, ABS, nylon, polycarbonate, polyethylene terephthalate, polyvinylidene fluoride, Teflon®, polyimide, phenol resin, and the like, which are available with a refractive index of 1.4 to 1.8.

A control technique is also available for increasing or decreasing the refractive index by mixing nanoparticles or the like, which allows the refractive index to be close to 1 in a plastic material mixed with hollow nano-silica. A refractive index of close to 2 can also be realized by mixing a resin with particles of a high-refractive-index material such as $TiO_2$ or the like.

Other examples of methods for controlling the refractive index of a transparent member include the use of a photonic crystal provided with a periodic structure of a dielectric, and the use of a plasmonic crystal with a metal microstructure. Each of the transparent members may also be an inert gas such as nitrogen or the like, a fluid, a gel, or the like.

Materials usable as the transparent electrodes will be described. A metal thin film with good electrical conductivity can be used as a transparent conductive film. For example, aluminum (Al) and silver (Ag) are desirable. Gold (Ag) having the advantage of being resistant to oxidation may be used as another example. Copper (Cu), characterized by good conductivity, is also available as another material.

Examples of other materials include platinum, rhodium, palladium, ruthenium, iridium, osmium, and the like, as materials characterized by having good thermal or chemical properties, having resistance to oxidation at high temperature, and not undergoing a chemical reaction with the substrate material. An alloy containing a plurality of metal materials may also be used.

MgAg and LiAl, in particular, are often used as thin-film transparent metal electrodes. A metal thin film has excellent electron transport performance, and is used as an electron transport electrode. Generally, an electrode made of a thin-film metal or a thin-film metal alloy is characterized by a high reflectance as seen from the light emitting layer.

On the other hand, materials having an excellent hole transport property will be described. Examples used as a hole transport electrode may include transparent oxide semiconductors (ITO, IZO, ZnO, and $InGaO_3$), and the like. A transparent oxide semiconductor has a refractive index close to that of an organic material, and is characterized by a low refractive index seen from the light emitting layer.

A conductive resin that can be produced at low cost using a coating method may be used as a transparent electrode. A perylene derivative, or a fullerene dielectric such as PCBM (phenyl C61 butyric acid methyl ester) or the like, may be used as a conductive resin material used as the electron transport electrode.

PCBM, for example, has the following optical constants of visible light (refractive index n=2.2, extinction coefficient κ=0.25), and thus, the electrode reflectance thereof seen from the light emitting layer is higher than that of the resin with a refractive index of 1.5. Examples of conductive resin materials used as the hole transport electrode may include PEDOT (Poly(3,4-ethylenedioxythiophene))/PSS(Poly(4-styrenesulfonate)), P3HT (Poly(3-hexylthiophene)), P3OT (Poly(3-octylthiophene)), P3DDT (Poly(3-dodecylthiophene-2,5-Diyl)), F8T2 (copolymer of fluorene and bithiophene), and the like.

PEDOT/PSS, for example, has the following optical constants of visible light (refractive index n=1.5, extinction coefficient κ=0.01), and the electrode reflectance thereof seen from the light emitting layer has a value equal to that of the resin with a refractive index of 1.5, and is relatively lower than that of PCBM.

To increase the electrical conductivity of the transparent electrode, a metallic mesh, metal nanowires, metal nanoparticles, or the like may also be used in combination. In this case, the electrical conductivity of the electrode incorporating metal nanowires increases to decrease an average refractive index, and thus, the reflectance thereof seen from the light emitting layer tends to increase.

Other Examples

It is essential in this embodiment to improve the electron injection property by combining two types of transparent electrodes, and bring the thus-changed luminous intensities of the front surface and the rear surface back to approximately equal luminous intensities, by setting the refractive indices of the transparent members to satisfy the conditions according to this embodiment.

FIG. 10 shows electroluminescent elements as Examples 5 through 16 based on this embodiment. The refractive indices of each of the first transparent member, the first transparent electrode, the light emitting layer, the second transparent electrode, and the second transparent member illustrated in FIG. 10 can be designed with the materials mentioned previously, and satisfy the requirements (Equation 9) and (Equation 10) according to this embodiment.

FIG. 11 shows electroluminescent elements as Examples 17 through 28 based on this embodiment. The refractive indices of each of the first transparent member, the first transparent electrode, the light emitting layer, the second transparent electrode, and the second transparent member shown in FIG. 11 can be designed with the materials mentioned previously, and satisfy the requirements (Equation 9) and (Equation 10) according to this embodiment. The refractive indices shown in FIG. 11 are also designed to satisfy the condition of refractive index (Equation 7) for a good electron injection property.

FIG. 12 shows electroluminescent elements as Examples 29 through 36 based on this embodiment. In these Examples, a hole transport material is used as first transparent electrode 11, and an electron transport material is used as second transparent electrode 12. The refractive indices of each of the first transparent member, the first transparent electrode, the light emitting layer, the second transparent electrode, and the second transparent member shown in FIG. 12 can be designed with the materials mentioned previously, and satisfy the requirements (Equation 9) and (Equation 10) according to this embodiment.

In the designs shown in FIG. 12, the transparent electrodes are formed of resin materials. Generally, when a transparent oxide semiconductor such as ITO or the like is used as a transparent electrode, a vacuum process such as sputtering or the like is required; however, in the case of a coating process, the vacuum process is unnecessary.

The designs shown in FIG. 12 can employ a coating process because the transparent electrodes are formed of resin materials, and thus, have the advantage of achieving a reduction in manufacturing cost. These designs are also suitable for volume production because the transparent electrodes can be formed with a simpler coating process, without using a vacuum process such as sputtering or the like.

FIG. 13 illustrates (10 types of) glass materials usable as materials of first transparent member 13 or second transparent member 14 (glass members from Ohara Inc.). Glass materials with a refractive index for visible light of 1.50 to 1.90 are available.

Other Embodiment

According to another embodiment based on this embodiment, a plurality of films, instead of a single film, may be combined to form a transparent electrode. When a metal thin film is used, for example, as a transparent electrode, it may be combined with a transparent conductive film to increase the conductive performance. FIGS. 14 and 15 show structures of electroluminescent elements as other Examples.

Particularly from the viewpoint of electron injection, it is desirable that a transparent electrode such as a metal thin film or the like having high electron injection performance be in contact with the cathode-side of the light emitting layer. From the viewpoint of the hole injection property, it is desirable that a transparent electrode such as ITO or the like having high hole injection performance be in contact with the anode-side of the light emitting layer.

A total thickness of the transparent electrode is desirably not greater than a wavelength of the light emitting layer, so as to enhance the effects of this embodiment. When $n_e$ denotes the refractive index of the light emitting layer, and $\lambda_o$ denotes the vacuum wavelength of emitted light, the wavelength of light from the light emitting layer can be represented by $\lambda_o/n_e$. For example, when the wavelength of light in vacuum is 550 nm and the refractive index of the light emitting layer is 1.8, the thickness of the transparent electrode is desirably not greater than 305 nm FIG. 14 shows a cross-sectional structure of organic electroluminescent element 100E as Example 37. In electroluminescent element 100E, first transparent electrode 11 has a two-layer structure, in which a transparent electrode 11a made of ITO is formed on first transparent member 13, and a transparent electrode 11b made of silver (Ag) is formed on light emitting layer 10.

FIG. 15 shows electroluminescent element 100F as Example 38. In electroluminescent element 100F, in comparison with electroluminescent element 100E shown in FIG. 14, second transparent electrode 12 has a three-layer structure, which includes transparent electrode 12a made of aluminum (Al), and transparent electrodes 12b and 12c made of a conductive resin that sandwich transparent electrode 12a.

Figure 16:
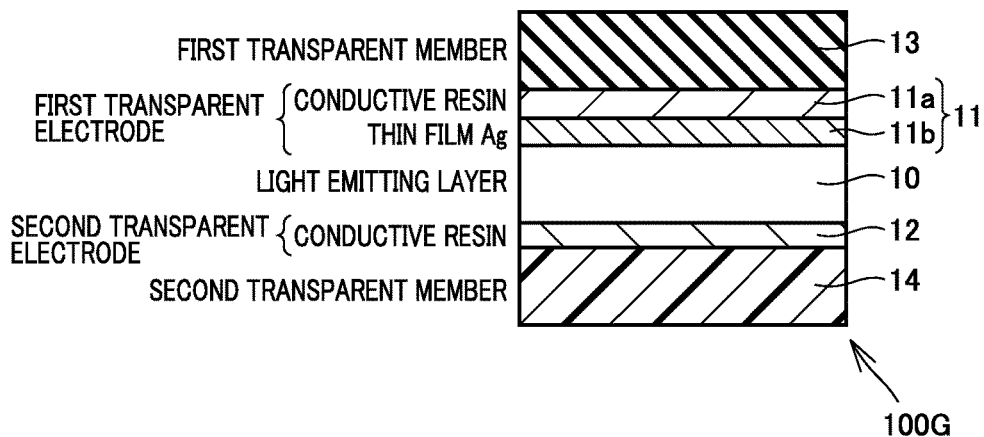
FIG. 16 is a diagram showing a cross-sectional structure of an organic electroluminescent element according to Example 39 based on the second embodiment.
Figure 17:
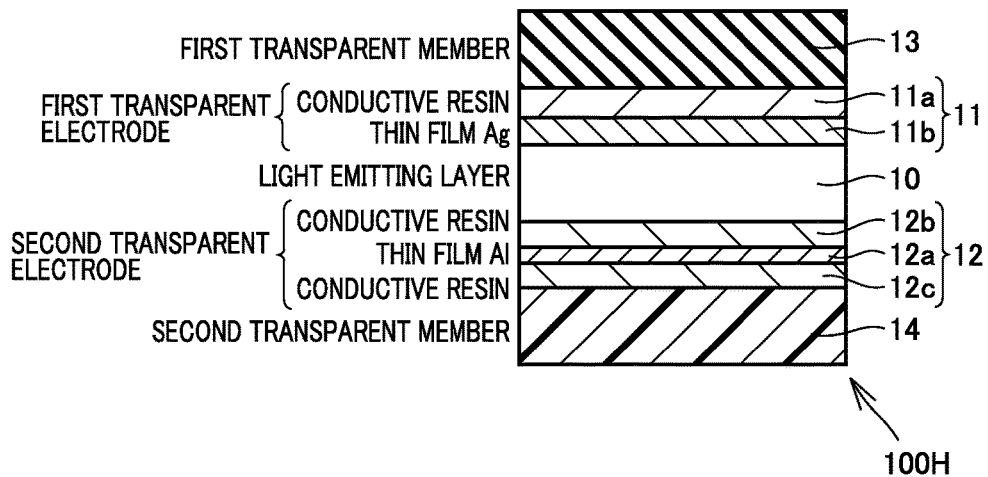
FIG. 17 is a diagram showing a cross-sectional structure of an organic electroluminescent element according to Example 40 based on the second embodiment.

The thickness of a transparent member is desirably not smaller than an optical wavelength in the transparent member, in order to increase the density of states in quantum optics. Specifically, when refractive index $n_{d1}$ of first transparent member 13=1.5 and the wavelength of light in vacuum is 550 nm, the thickness of first transparent member 13 is desirably not smaller than 550/1.5=367 nm FIG. 16 shows electroluminescent element 100G as Example 39. In electroluminescent element 100G, a conductive resin is used as transparent electrode 11a of electroluminescent element 100E shown in FIG. 14. Electroluminescent element 100G is otherwise identical to electroluminescent element 100E. FIG. 17 shows electroluminescent element 100H as Example 40. In electroluminescent element 100H, transparent electrode 11a of electroluminescent element 100F shown in FIG. 15 is made of a conductive resin. Electroluminescent element 100H is otherwise identical to electroluminescent element 100F. When a conductive resin instead of ITO is used as transparent electrode 11a, since the conductive resin can be produced using a coating process, the electroluminescent element is suitable for volume production.

Figure 18:
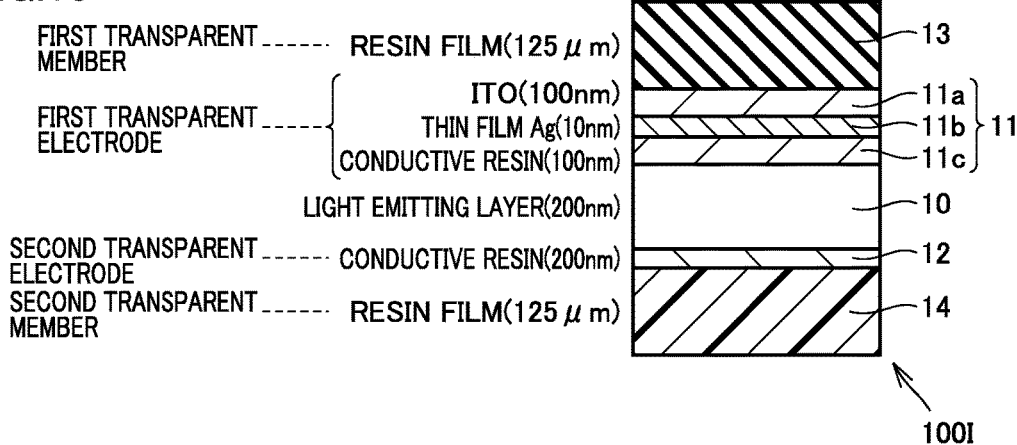
FIG. 18 is a diagram showing a cross-sectional structure of an organic electroluminescent element according to Example 41 based on the second embodiment.
Figure 19:
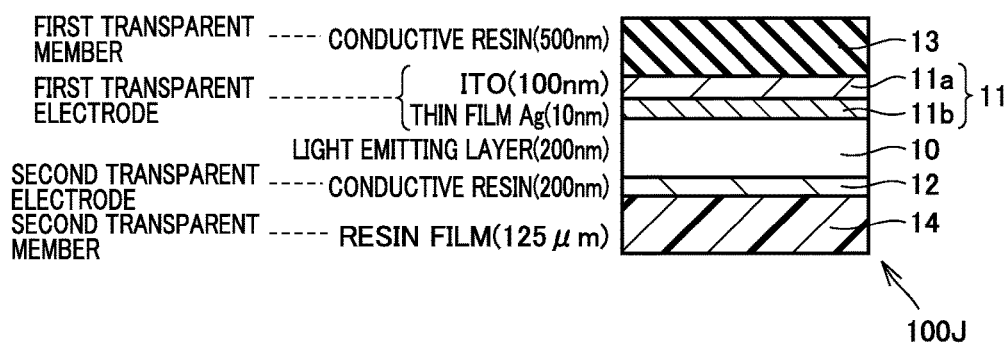
FIG. 19 is a diagram showing a cross-sectional structure of an organic electroluminescent element according to Example 42 based on the second embodiment.

When a transparent member itself is provided with conductivity, the electron injection property can be improved with the aid of electrode performance. FIGS. 18 and 19 show specific examples of thickness compositions of the transparent members and the transparent electrodes. These thickness compositions satisfy the condition that the thickness of each transparent electrode is not greater than a wavelength of the light emitting layer and the thickness of each transparent member is not smaller than a wavelength of the transparent member.

In electroluminescent element 100I as Example 41 shown in FIG. 18, second transparent member 14 is made of a resin film with a thickness of 125 μm. Second transparent electrode 12 is made of a conductive resin with a thickness of 200 nm Light emitting layer 10 has a thickness of 200 nm First transparent electrode 11 has a three-layer structure including 100-thick transparent electrode 11a made of ITO, 10-nm thick transparent electrode 11b made of silver (Ag), and 100-nm thick transparent electrode 11c made of a conductive resin. First transparent member 13 is made of a resin film with a thickness of 125 μm.

In electroluminescent element 100J as Example 42 shown in FIG. 19, second transparent member 14 is made of a resin film with a thickness of 125 μm. Second transparent electrode 12 is made of a conductive resin with a thickness of 200 nm Light emitting layer 10 has a thickness of 200 nm First transparent electrode 11 has a two-layer structure including 100-nm thick transparent electrode 11a made of ITO and 10-nm thick transparent electrode 11b made of silver (Ag). First transparent member 13 is made of a conductive resin with a thickness of 500 nm Each of the above-described electroluminescent elements shown in FIGS. 18 and 19 can also be realized as an organic electroluminescent element that exhibits a more approximately equal ratio of the luminous intensities of both surfaces, while enhancing the electron injection performance.

Figure 20:
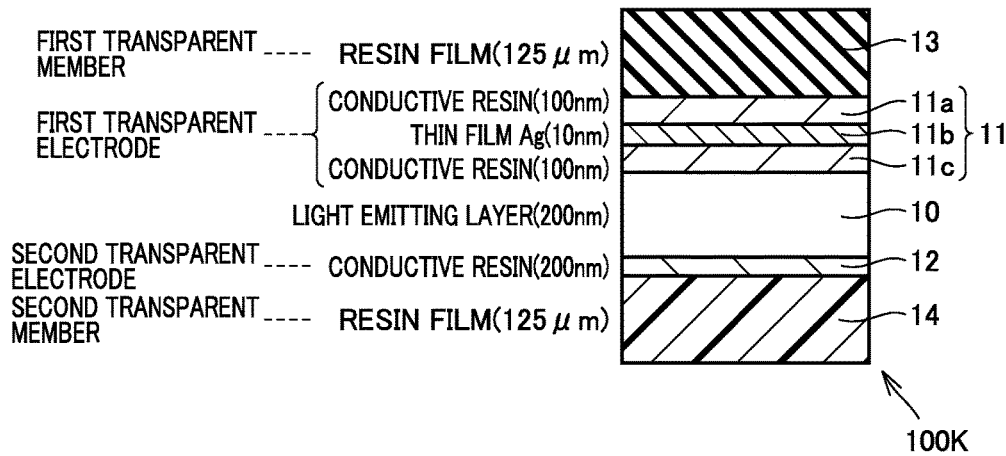
FIG. 20 is a diagram showing a cross-sectional structure of an organic electroluminescent element according to Example 43 based on the second embodiment.
Figure 21:
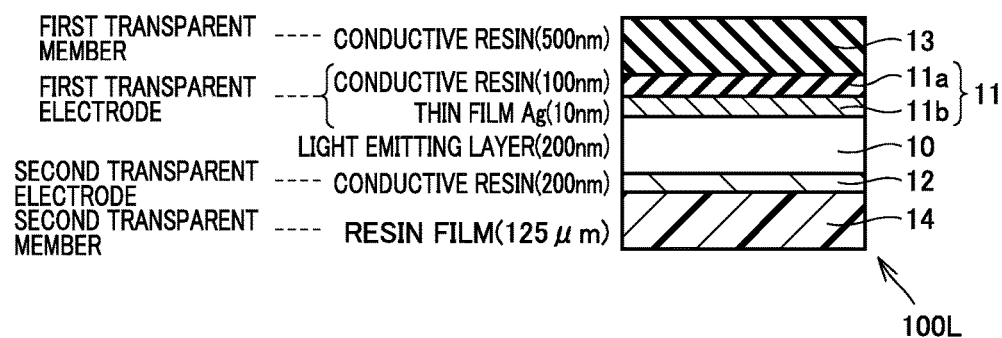
FIG. 21 is a diagram showing a cross-sectional structure of an organic electroluminescent element according to Example 44 based on the second embodiment.

FIG. 20 shows electroluminescent element 100K as Example 43. In electroluminescent element 100K, transparent electrode 11a of electroluminescent element 100I shown in FIG. 18 is made of a conductive resin. Electroluminescent element 100K is otherwise identical to electroluminescent element 100I. FIG. 21 shows electroluminescent element 100L as Example 44. In electroluminescent element 100L, transparent electrode 11a of electroluminescent element 100J shown in FIG. 19 is made of a conductive resin. Electroluminescent element 100L is otherwise identical to electroluminescent element 100J. In this electroluminescent element 100L, first transparent member 13 and transparent electrode 11a are made of the same conductive resin, and thus, they may be formed of a single layer produced in the same manufacturing step. When a conductive resin instead of ITO is used as transparent electrode 11a, since the conductive resin can be produced using a coating process, the electroluminescent element is suitable for volume production.

The light emitting layer may have an alternative structure in which an electron injection layer (EIL) or an electron transport layer (EIL) is formed on the cathode-side, and a hole injection layer (HTL) or a hole transport layer (HTL) is formed on the anode-side.

Figure 22:
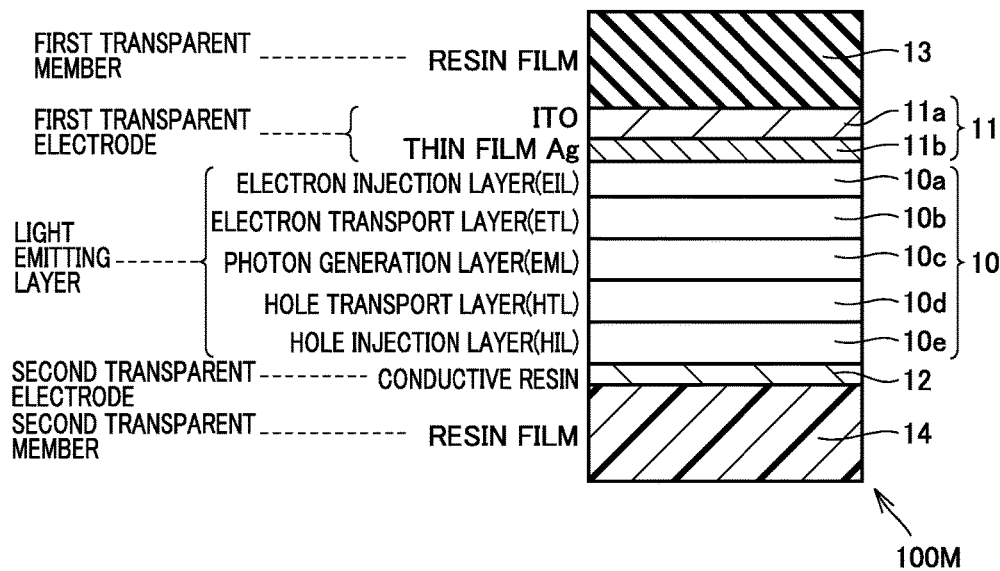
FIG. 22 is a diagram showing a cross-sectional structure of an organic electroluminescent element according to Example 45 based on the second embodiment.

FIG. 22 shows electroluminescent element 100M as Example 45. Electroluminescent element 100M shown in FIG. 22 may be envisaged as an exemplary structure including the inside structure of light emitting layer 10. In comparison with electroluminescent element 100J shown in FIG. 19, light emitting layer 10 of electroluminescent element 100M has a five-layer structure including an electron injection layer (EIL) 10a, an electron transport layer (ETL) 10b, a photon generation layer (EML) 10c, a hole transport layer (HTL) 10d, and a hole injection layer (HIL) 10e as seen from first transparent electrode 11.

The above-described electroluminescent element 100M shown in FIG. 22 can also be realized as an organic electroluminescent element having a more approximately equal ratio of the luminous intensities of both surfaces, while enhancing the electron injection performance.

Figure 23:
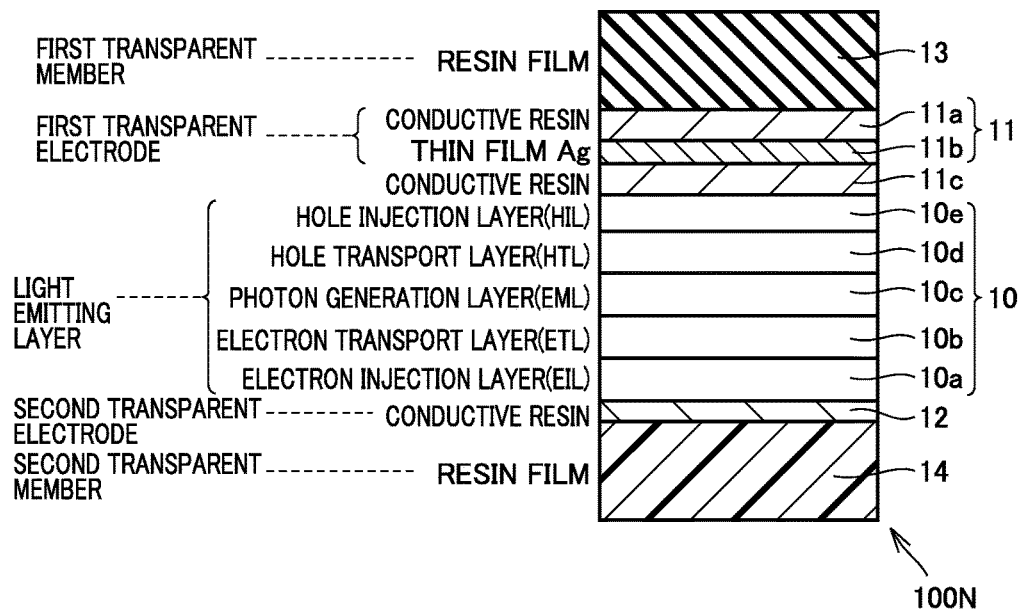
FIG. 23 is a diagram showing a cross-sectional structure of an organic electroluminescent element according to Example 46 based on the second embodiment.

FIG. 23 shows electroluminescent element 100N as Example 46. Electroluminescent element 100N is a modification of the above-described electroluminescent element 100M shown in FIG. 22, and has a structure in which first transparent electrode 11 may serve as the anode without being limited to the cathode. First transparent electrode 11 as the anode has a three-layer structure including transparent electrodes 11a, 11c made of a conductive resin having an excellent hole injection property, and transparent electrode 11b made of silver (Ag). Light emitting layer 10 has a five-layer structure including hole injection layer (HIL) 10e, hole transport layer (HTL) 10d, photon generation layer (EML) 10c, electron transport layer (ETL) 10b, and electron injection layer (EIL) 10a as seen from first transparent electrode 11. Second transparent electrode 12 as the cathode is made of a conductive resin having a high electron injection property (perylene derivative).

Third Embodiment

FIG. 24 shows a lighting apparatus 200 including electroluminescent elements according to this embodiment. This lighting apparatus 200 has transparent partition plates 210, each of which produces light with approximately equal intensities from both surfaces thereof, and is transparent while being turned OFF. Specifically, lighting apparatus 200 is a showcase, and has a stack of a plurality of display shelves 201.

Articles 202 as objects to be illuminated are placed on each display shelf 201. Partition plate 210 including an electroluminescent element according to this embodiment is disposed on each display shelf 201.

When the electroluminescent element is used as a partition for a display shelve 201 on which articles 202 are arranged, it can produce light with approximately equal intensities from both sides thereof, and allows opposite sides to be seen through while being turned OFF. This allows the space to seem expansive, without giving an oppressive feeling as compared with a conventional opaque lighting apparatus.

Although the application of the electroluminescent elements according to this embodiment to partition plates 210 has been described with FIG. 24, the electroluminescent elements according to this embodiment may also be applied to display shelves 201. In this case, light with approximately equal intensities is produced in the vertical direction, allowing articles to be illuminated without casting shadows.

Although lighting apparatus 200 has been described as a showcase by way of example, it may also be used as a lighting apparatus for exhibits in museums, and a lighting apparatus for a window in a house or a car, for example.

In the foregoing surface emitting element according to this embodiment, a difference in luminous intensity between the front surface and the rear surface, which has been present in cases without using first transparent member 13 and second transparent member 14, can be reduced while maintaining transparency.

The drive voltage is reduced by sandwiching the light emitting layer between the electron transport electrode and the hole transport electrode, and thus, light can be emitted more efficiently. A difference in luminous intensity can be reduced while maintaining the electron injection property, by setting the values of the refractive indices as described in the foregoing embodiments. The electrode performance can be improved by using a metal electrode as first transparent electrode 11. The lighting apparatus including the surface emitting elements based on this embodiment can provide an approximately equal luminous distribution, and thus, can be realized as a lighting apparatus having an excellent illumination design.

While the foregoing has described the various electroluminescent elements according to the various embodiments and the lighting apparatus including the electroluminescent elements, it should be understood that the embodiments disclosed herein are illustrative and non-restrictive in every respect. It is therefore intended that the scope of the present invention is defined by the terms of the claims, and includes all modifications within the scope and meaning equivalent to the claims.

REFERENCE SIGNS LIST 1, 100 A, 100 B, 100 C, 100 D, 100 E, 100 F, 100 G, 100 H, 100 I, 100 J, 100 K, 100 L, 100 M, 100N: electroluminescent element; 10: light emitting layer; 11: first transparent electrode; 11a, 11b, 11c, 12a, 12b: transparent electrode; 12: second transparent electrode; 13: first transparent member; 14: second transparent member; 200: lighting apparatus; 201: display shelf; 202: article; 210: partition plate.

The invention claimed is:

1. An electroluminescent element comprising:
   a first transparent electrode;
   a second transparent electrode;
   a light emitting layer sandwiched between said first transparent electrode and said second transparent electrode;
   a first transparent member formed on a surface of said first transparent electrode opposite to said light emitting layer; and
   a second transparent member formed on a surface of said second transparent electrode opposite to said light emitting layer,
   wherein refractive indices of said first transparent electrode and said second transparent electrode are such that as seen from said light emitting layer, a reflectance of an interface between said light emitting layer and said first transparent electrode is higher than a reflectance of an interface between said light emitting layer and said second transparent electrode,
   a refractive index of said first transparent member is higher than a refractive index of said second transparent member,
   each of a thickness of said first transparent electrode and a thickness of said second transparent electrode is not greater than a wavelength of light in said light emitting layer emitted from said light emitting layer,
   a thickness of said first transparent member is not smaller than a wavelength of light in said first transparent member, and
   a thickness of said second transparent member is not smaller than a wavelength of light in said second transparent member.

2. The electroluminescent element according to claim 1, wherein
   said first transparent electrode is an electron transport electrode, and said second transparent electrode is a hole transport electrode.

3. The electroluminescent element according to claim 2, wherein
   said first transparent electrode includes a metal thin film.

4. The electroluminescent element according to claim 1, wherein
said first transparent electrode is a thin-film metal, and said second transparent electrode is ITO.

5. The electroluminescent element according to claim 1, wherein
said first transparent electrode has a two-layer structure in which ITO is formed on said first transparent member, and a thin-film metal is formed on said light emitting layer, and
said second transparent electrode is ITO.

6. The electroluminescent element according to claim 1, wherein
said first transparent electrode has a two-layer structure in which ITO is formed on said first transparent member, and a thin-film metal is formed on said light emitting layer, and
said second transparent electrode has a three-layer structure in which a conductive resin is formed on each of said second transparent member and said light emitting layer, and a thin-film metal is sandwiched between two films of said conductive resin.

7. The electroluminescent element according to claim 1, wherein
said first transparent electrode has a two-layer structure in which a conductive resin is formed on said first transparent member, and a thin-film metal is formed on said light emitting layer, and
said second transparent electrode is a conductive resin.

8. The electroluminescent element according to claim 1, wherein
said first transparent electrode has a two-layer structure in which a conductive resin is formed on said first transparent member, and a thin-film metal is formed on a said light emitting layer, and
said second transparent electrode has a three-layer structure in which a conductive resin is formed on each of said second transparent member and said light emitting layer, and a thin-film metal is sandwiched between two films of said conductive resin.

9. The electroluminescent element according to claim 1, wherein
said first transparent electrode has a three-layer structure in which ITO is formed on said first transparent member, a conductive resin is formed on said light emitting layer, and a thin-film metal is sandwiched between said ITO and said conductive resin, and
said second transparent electrode is a conductive resin.

10. The electroluminescent element according to claim 1, wherein
said first transparent electrode has a two-layer structure in which ITO is formed on said first transparent member, and a thin-film metal is formed on a said light emitting layer, and
said second transparent electrode is a conductive resin.

11. The electroluminescent element according to claim 1, wherein
said first transparent electrode has a three-layer structure in which a conductive resin is formed on each of said first transparent member and said light emitting layer, and a thin-film metal is sandwiched between two films of said conductive resin, and
said second transparent electrode is a conductive resin.

12. A lighting apparatus comprising the electroluminescent element according to claim 1.

13. The electroluminescent element according to claim 1, wherein
said first transparent electrode includes a metal thin film.

14. The electroluminescent element according to claim 1, wherein the electroluminescent element is transparent and is a double-sided electroluminescent element configured to emit light from both a first surface and a second surface.

15. The electroluminescent element according to claim 1, wherein luminous intensity of a light that exits outside through the first transparent member is substantially equal to the luminous intensity of a light that exits outside through the second transparent member.

* * * * *